(12) United States Patent
Tsai

(10) Patent No.: US 11,676,823 B2
(45) Date of Patent: Jun. 13, 2023

(54) METHOD FOR FABRICATING SEMICONDUCTOR DEVICE

(71) Applicant: UNITED MICROELECTRONICS CORP., Hsin-Chu (TW)

(72) Inventor: Tsung-Hsun Tsai, Chiayi County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/485,541

(22) Filed: Sep. 27, 2021

(65) Prior Publication Data

US 2023/0064701 A1  Mar. 2, 2023

(30) Foreign Application Priority Data

Aug. 26, 2021  (CN) .................. 202110987039.7

(51) Int. Cl.
  *H01L 21/311* (2006.01)
  *H01L 21/02* (2006.01)
  *H01L 27/12* (2006.01)
  *H01L 21/8234* (2006.01)
  *H01L 21/8238* (2006.01)

(52) U.S. Cl.
  CPC .. *H01L 21/31105* (2013.01); *H01L 21/02107* (2013.01); *H01L 21/31144* (2013.01); *H01L 21/823462* (2013.01); *H01L 21/823857* (2013.01); *H01L 27/1237* (2013.01)

(58) Field of Classification Search
  None
  See application file for complete search history.

(56) References Cited

U.S. PATENT DOCUMENTS

2003/0109097 A1\* 6/2003 Yamada .......... H01L 21/823462
                                            257/E21.628
2019/0304812 A1\* 10/2019 Lin .................. H01L 21/67103

FOREIGN PATENT DOCUMENTS

JP   2002367980   \* 12/2002  .......... H01L 21/312
WO   2007/082745      7/2007

OTHER PUBLICATIONS

J.M. Bustillo et al., "Surface Micromachining for Microelectromechanical System", Proc. of the IEEE, vol. 86, pp. 1552-1574. (Year: 1986).\*

\* cited by examiner

Primary Examiner — Jiong-Ping Lu
(74) Attorney, Agent, or Firm — Winston Hsu

(57) ABSTRACT

A method for fabricating a semiconductor device includes the steps of: providing a substrate having a first region, a second region, and a third region; forming a first gate oxide layer on the first region, the second region, and the third region; and performing an etching process and an infrared treatment process at the same time to completely remove the first gate oxide layer on the second region for exposing the substrate.

6 Claims, 5 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method of using etching process and infrared treatment process for removing gate oxide layers.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal gate transistors in particular during the front-end stage when photo-etching processes are conducted to remove gate oxide layer from the surface of the substrate, electrical charges often accumulate and create difficulty for etchant to remove the gate oxide layer completely thereby affecting performance of the device. Hence, how to resolve this issue has become an important task in this field.

SUMMARY OF THE INVENTION

According to an embodiment of the present invention, a method for fabricating a semiconductor device includes the steps of: providing a substrate having a first region, a second region, and a third region; forming a first gate oxide layer on the first region, the second region, and the third region; and performing an etching process and an infrared treatment process at the same time to completely remove the first gate oxide layer on the second region for exposing the substrate.

Typically, it has been observed that lower transmittance of current patterned resist used during pattern transfer process is likely to build charges and this accumulation of charges indirectly increases difficulty for etchant to completely remove gate oxide layer from the surface of the substrate. To resolve this issue the present invention preferably conducts an infrared treatment process along with the etching process to release accumulated charges for extending reaction time of the etchant used in the etching process and by doing so, it would be desirable to completely remove the gate oxide layer and expose the surface of the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
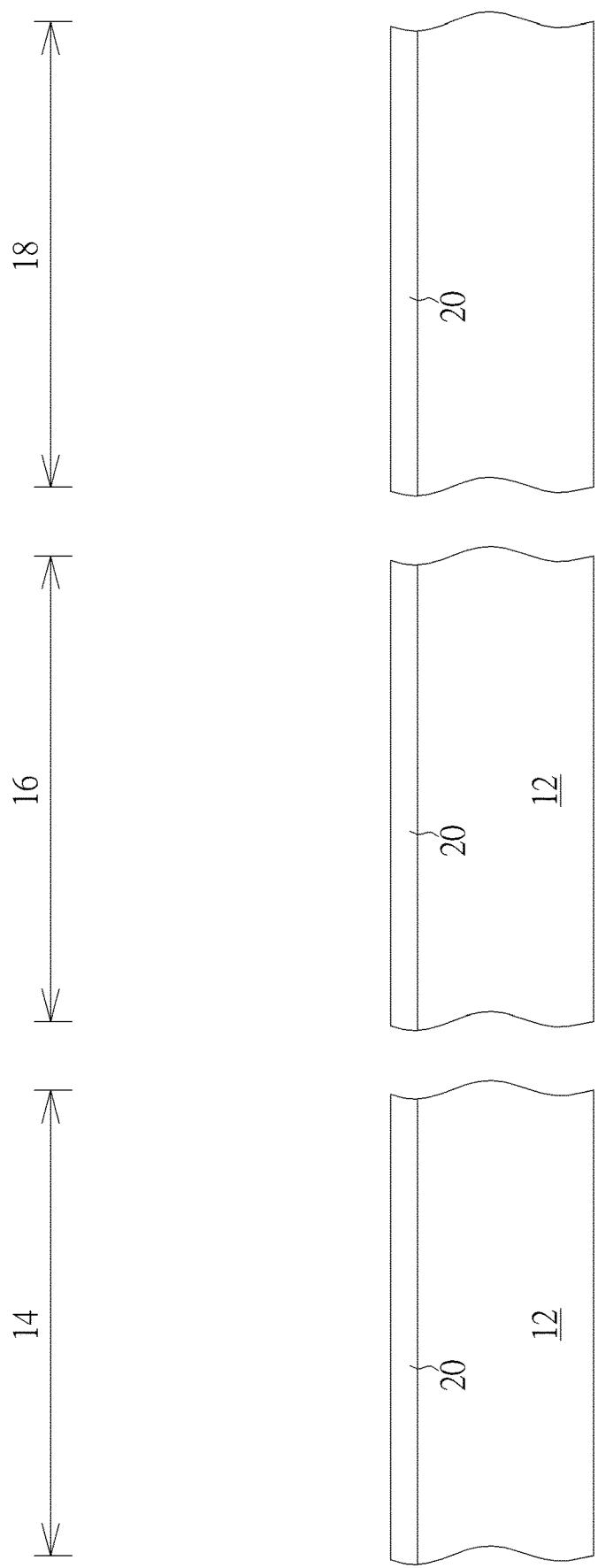
FIGS. 1-5 illustrate a method for fabricating a semiconductor device according to an embodiment of the present invention.

Referring to FIGS. 1-5, FIGS. 1-5 illustrate a method for fabricating a semiconductor device according to an embodiment of the present invention. As shown in FIG. 1, a substrate 12, such as a silicon substrate or silicon-on-insulator (SOI) substrate is provided, and a first region 14, a second region 16, and a third region 18 are defined on the substrate 12, in which the three regions 14, 16, 18 are defined to fabricate gate structures having different threshold voltages in the later process. Specifically, the first region 14 includes a core region, the second region 16 includes a middle gate region, and the third region 18 includes an input/output region.

Next, an oxide growth process or more specifically a rapid thermal oxidation (RTO) process is conducted to form a gate oxide layer 20 made of silicon oxide on the first region 14, the second region 16, and the third region 18, in which the gate oxide layer 20 formed at this stage on each region is preferably between 49-51 Angstroms or most preferably at 50 Angstroms.

Figure 2:
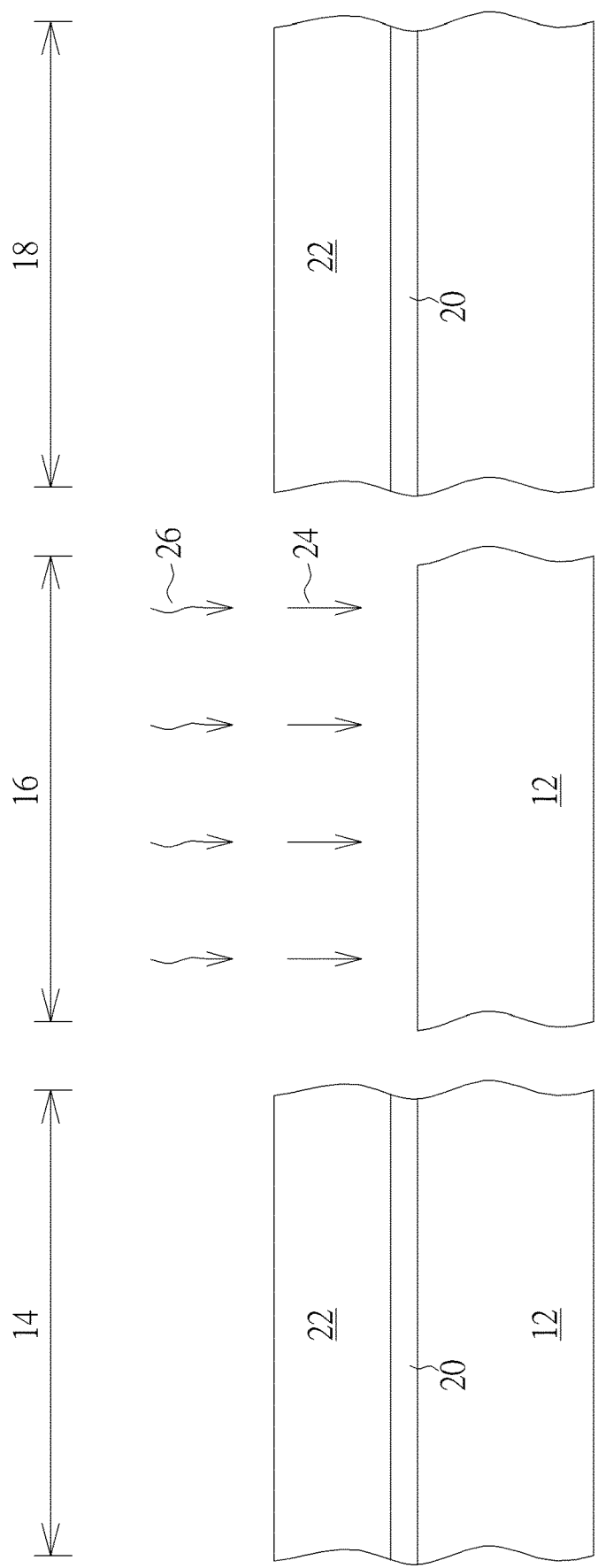

Next, as shown in FIG. 2, a patterned mask 22 such as a patterned resist is formed on the first region 14 and the third region 18 and exposing the gate oxide layer 20 on the second region 16, and then an etching process 24 and an infrared treatment process 26 are conducted by using the patterned mask 22 as mask to remove the gate oxide layer 20 on the second region 16. In this embodiment, the etchant used in the etching process 24 preferably includes diluted hydrofluoric acid (dHF) and the duration of the etching process 24 is approximately 215 seconds.

Typically, lower transmittance rate of current patterned resist used during pattern transfer process is likely to build up electrical charges and this accumulation of high charges also indirectly increases difficulty for the etchant such as dHF to remove the gate oxide layer 20 from the surface of the substrate 12. To resolve this issue the present invention preferably conducts an infrared treatment process 26 at the same time with the aforementioned etching process 24 to release the accumulated charges for extending reaction or operation time of the etchant used in the etching process 24. By doing so it would be desirable to completely remove the gate oxide layer 20 on the second region 16 and expose the surface of the substrate 12.

It should be noted that since resist with low transmittance could result in accumulation of electrical charges, it would be desirable to conduct the infrared treatment process 26 to remove the gate oxide layer 20 on the second region 16 if the transmittance of the patterned mask 22 or patterned resist is lower than 7.9%. Moreover, the wavelength of the infrared treatment process 26 used in this embodiment is between 500-10000 nm, more preferably between 850-940 nm, or most preferably at 865 nm.

Next, a selective inspection or examination process could be conducted to verify whether the gate oxide layer 20 is completely removed from the second region 16. Preferably, after the etching process 24 is conducted to remove the gate oxide layer 20 on the second region 16, none of the gate oxide layer would remain on the surface of the substrate 12 on second region 16 while a gate oxide layer 20 each having a thickness of approximately 50 Angstroms would still remain on the substrate 12 surface on the first region 14 and third region 18.

Figure 3:
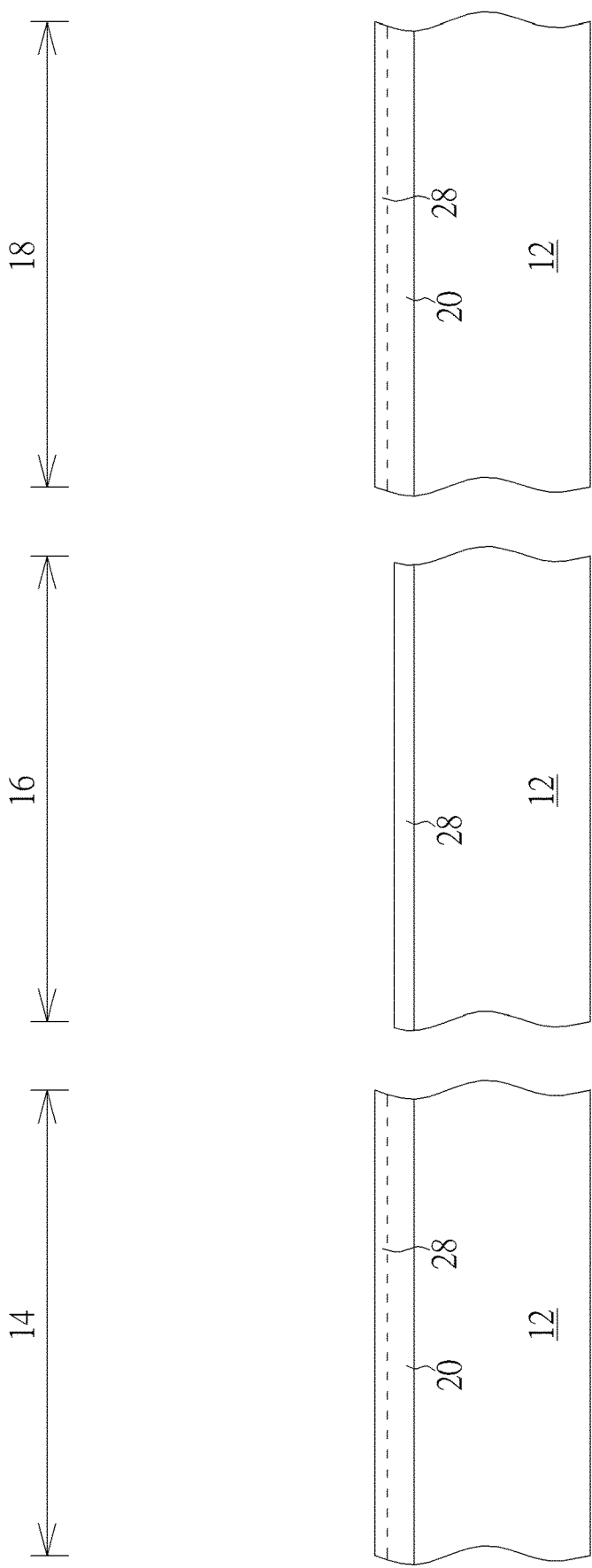

Next, as shown in FIG. 3, the patterned mask 22 on the first region 14 and third region 18 are removed to expose the gate oxide layer 20 on the first region 14 and third region 18 and the substrate 12 surface on the second region 16, and then another oxide growth process or RTO process is conducted to form a gate oxide layer 28 made of silicon oxide on the first region 14, the second region 16, and the third region 18. It should be noted that since RTO process typically grows thinner gate oxide layer on region that already has gate oxide layer thereon and thicker gate oxide layer on region that has no gate oxide layer thereon, it would be desirable to form a thinner gate oxide layer 28 on the gate oxide layer 20 on the first region 14 and third region 18 and a thicker gate oxide layer 28 on the surface of the substrate 12 on the second region 16 during the RTO process conducted at this stage.

After the RTO process is conducted, the overall thickness of the gate oxide layer such as a combined thickness of the gate oxide layer 20 and gate oxide layer 28 on each of the first region 14 and third region 18 is grown from 50 Angstroms to approximately 54 Angstroms and the total thickness of the gate oxide layer 28 on the second region 16 is grown to about half the total thickness of the gate oxide layer on the first region 14 and/or third region 18. For instance, the overall thickness of the gate oxide layer 28 on the second region 16 is between 29-30 Angstroms or most preferably at 29.5 Angstroms.

Figure 4:
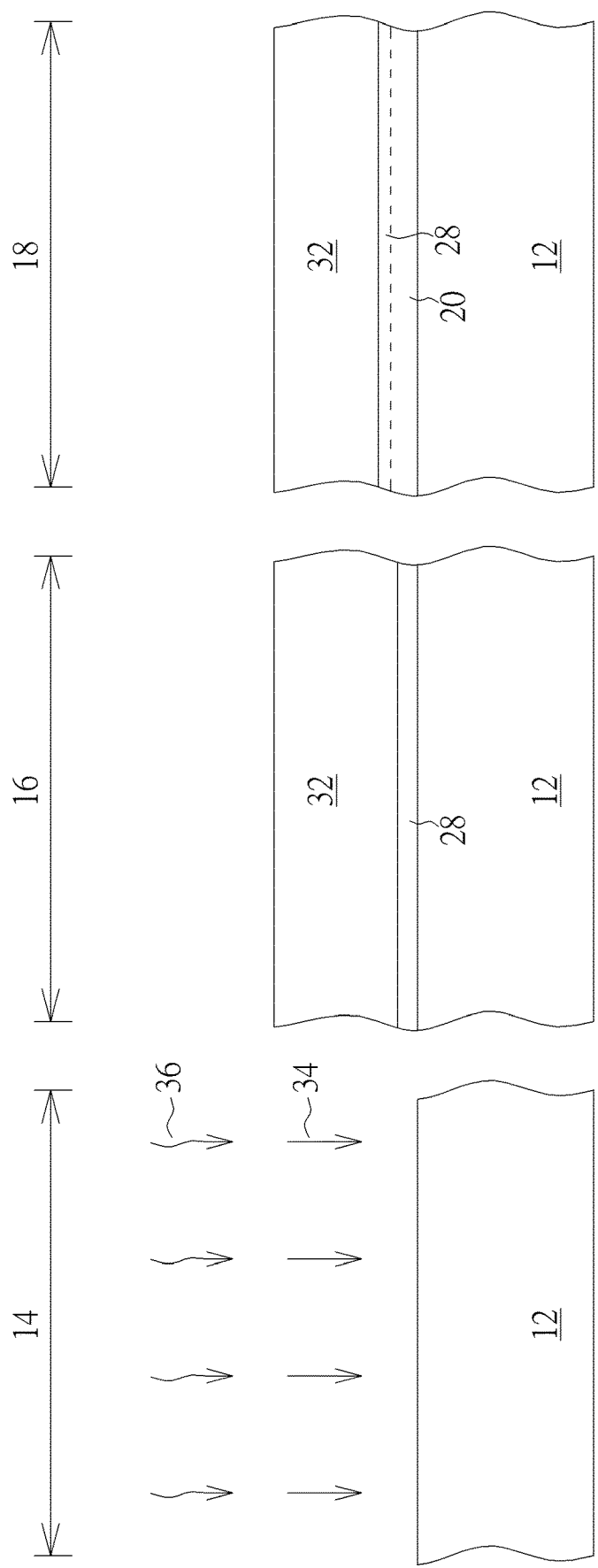

Next, as shown in FIG. 4, a patterned mask 32 such as a patterned resist is formed on the second region 16 and third region 18 to expose the gate oxide layer 28 on the first region 14, and then an etching process 34 and an infrared treatment process 36 are conducted at the same time by using the patterned mask 32 as mask to remove two gate oxide layers including the gate oxide layer 28 and gate oxide layer 20 on the first region 14. Similar to the etching process conducted in FIG. 2, the etchant used in the etching process 34 preferably includes diluted hydrofluoric acid (dHF) and the duration of the etching process 24 is approximately 215 seconds.

If the transmittance of the patterned mask 32 or patterned resist is lower than 75% or more preferably lower than 65.4% when the two gate oxide layers 20, 28 on the first region 14 were removed, it would be desirable to conduct the infrared treatment process 36 along with the etching process 34 to completely remove the gate oxide layers 20, 28 on the first region 14. Moreover, the wavelength of the infrared treatment process 36 used in this embodiment is between 500-10000 nm, more preferably between 850-940 nm, or most preferably at 865 nm.

Figure 5:
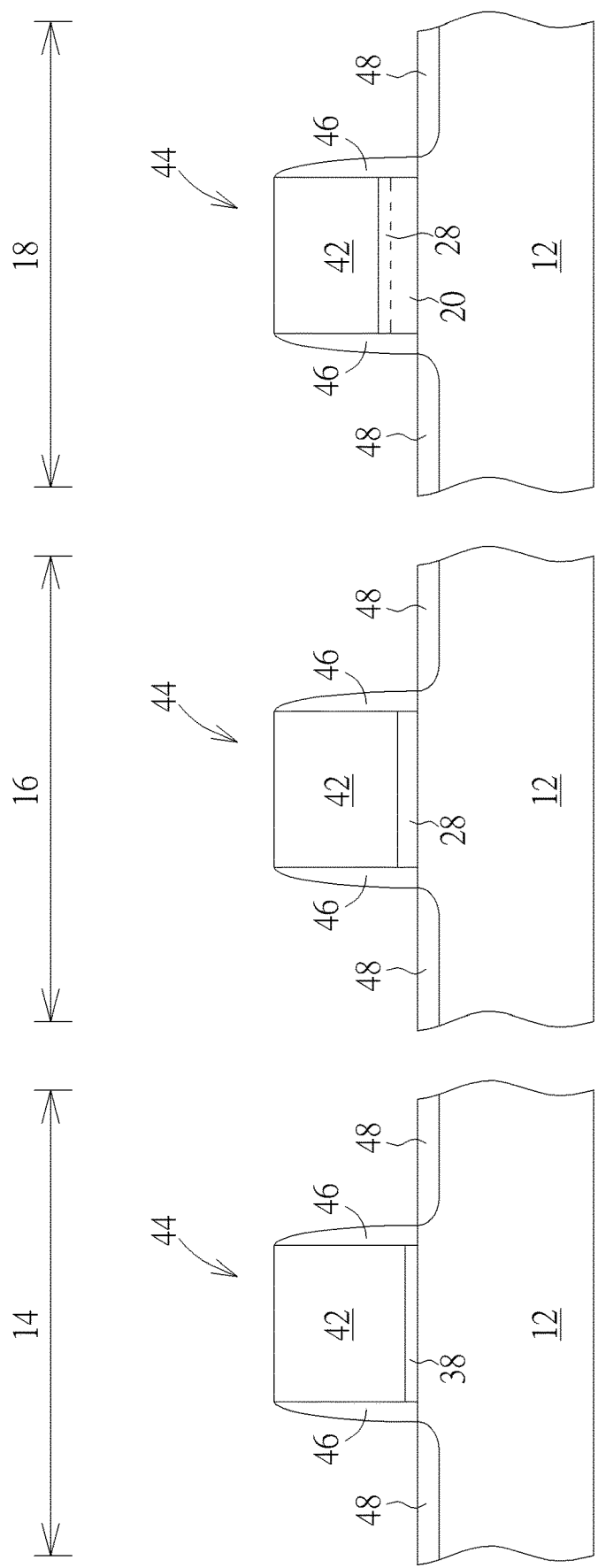

Next, as shown in FIG. 5, an oxidation process such as an in-situ steam generation (ISSG) process could be conducted to form a gate oxide layer 38 made of silicon oxide on the first region 14, and then the patterned mask 32 on the second region 16 and third region 18 is removed thereafter. In alternative to this order, according to an embodiment of the present invention, it would also be desirable to first remove the patterned mask 32, conduct the ISSG process to form another gate oxide layer 38 on the first region 14, second region 16, and third region 18, which is also within the scope of the present invention. Next, formation of transistor elements such as gate structures, spacers, and source/drain regions could be carried out afterwards depending on the demand of the product.

For instance, the formation of the gate structures could be accomplished by first forming a gate material layer and a selective hard mask (not shown) on the substrate 12 of first region 14, second region 16, and third region 18 including the gate oxide layer 38 on the first region 14, the gate oxide layer 38 on the second region 16, and the gate oxide layer 28 on the third region 18, and then conducting a pattern transfer process by using a patterned resist (not shown) as mask to remove part of the gate material layer and part of the gate oxide layers 20, 28, 38 through single or multiple etching processes for forming a gate structure 44 made of a patterned gate oxide layer 38 and a patterned gate material layer 42 on the first region 14, a gate structure 44 made of a patterned gate oxide layer 28 and a patterned gate material layer 42 on the second region 16, and a gate structure 44 made of patterned gate oxide layers 20, 28 and a gate material layer 42 on the third region 18. In this embodiment, the gate material layer 42 serving as gate electrodes could include polysilicon, but not limited thereto.

Next, at least a spacer 46 is formed on sidewalls of each of the gate structures 44, source/drain regions 48 and/or epitaxial layers (not shown) are formed in the substrate 12 adjacent to two sides of the spacers 46, and selective silicides (not shown) could be formed on the surface of the source/drain regions 48 and/or epitaxial layers. In this embodiment, each of the spacers 46 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 48 could include n-type dopants or p-type dopants depending on the type of device being fabricated and the epitaxial layers could include silicon germanium (SiGe), silicon carbide (SiC), or silicon phosphide (SiP).

Next, an interlayer dielectric (ILD) layer could be formed on the gate structures 44, a selective replacement metal gate (RMG) process could be conducted to transform the gate structures 44 into metal gates, and contact plugs could be formed in the ILD layer adjacent to two sides of the gate structures 44 for connecting to the source/drain regions 48. Since the process of transforming polysilicon gates into metal gates and formation of the conduct plugs are well known to those skilled in the art, the details of which are not explained herein for the sake of brevity.

Typically, it has been observed that low transmittance of current patterned resist used during pattern transfer process is likely to build charges and this accumulation of charges indirectly increases difficulty for etchant to completely remove gate oxide layer from the surface of the substrate. To resolve this issue the present invention preferably conducts an infrared treatment process along with the etching process to release accumulated charges for extending reaction time of the etchant used in the etching process and by doing so, it would be desirable to completely remove the gate oxide layer and expose the surface of the substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate having a first region, a second region, and a third region;
   forming a first gate oxide layer on the first region, the second region, and the third region;
   forming a patterned mask on the first region and the third region, wherein the patterned mask builds up accumulated charges; and performing an etching process and an infrared treatment process at the same time to remove the first gate oxide layer on the second region and the accumulated charges.

2. The method of claim 1, further comprising:
forming a second gate oxide layer on the first region, the second region, and the third region;
removing the first gate oxide layer and the second gate oxide layer on the first region; and
forming a third gate oxide layer on the first region.

3. The method of claim 1, further comprising performing the etching process and the infrared treatment process to completely remove the first gate oxide layer on the second region for exposing the substrate.

4. The method of claim 1, further comprising performing an inspecting process to verify the removal of the first gate oxide layer on the second region.

5. The method of claim 1, wherein the first region comprises a core region.

6. The method of claim 1, wherein the third region comprises an input/output (I/O) region.

* * * * *